United States Patent [19]

Tam

[11] Patent Number: 4,814,258
[45] Date of Patent: Mar. 21, 1989

[54] PMGI BI-LAYER LIFT-OFF PROCESS

[75] Inventor: Gordon Tam, Chandler, Ariz.

[73] Assignee: Motorola Inc., Schaumburg, Ill.

[21] Appl. No.: 77,357

[22] Filed: Jul. 24, 1987

[51] Int. Cl.$^4$ .......................... G03C 1/495; G03C 1/76
[52] U.S. Cl. ..................................... 430/315; 430/156;
430/312; 430/319; 430/324; 430/327
[58] Field of Search ............... 430/315, 327, 312, 319, 430/324, 156

[56] References Cited

U.S. PATENT DOCUMENTS

| | | | |
|---|---|---|---|
| 4,212,935 | 7/1980 | Canavello et al. | 430/327 |
| 4,524,121 | 6/1985 | Gleim et al. | 430/176 |
| 4,567,132 | 1/1986 | Fredericks et al. | 430/312 |
| 4,569,897 | 2/1986 | Kalyanaraman | 430/197 |

OTHER PUBLICATIONS

IBM Technical Disclosure, vol. 20, No. 7, Dec. 1977, p. 2671.
IBM Technical Disclosure, vol. 26, No. 4, Sep. 1983, pp. 1955-1959.
Hovel et al., "Improved Metal Removal For Integrated Circuit Fabrication"; Insulation/Circuits, vol. 27, No. 2, Feb. 1981.
Sasago et al., "Improved Bilayer Resist System Using Contrast-Enhanced Lithography with Water-Soluble Photopolymer", SPIE vol. 631, Advances in Resist Technology and Processing 111, 1986, pp. 321-329.
Chao et al., "A Submicron Gate-Wall Structure For Low-Noise MESFET's", Conference: International Electron Devices Meeting, Washington D.C. U.S.A., Dec. 7-9, 1981.

Primary Examiner—Paul R. Michl
Assistant Examiner—Mark Buscher
Attorney, Agent, or Firm—Joe E. Barbee

[57] ABSTRACT

An effective bi-layer photoresist structure comprising a bottom planarization layer or PMGI and a top photoresist imaging layer which eliminates an intermixing layer between the top photoresist imaging layer and the bottom planarization layer, and provides a desired undercut profile between the two layers to insure efficient lift-off for gate fabrication, said undercut profile formed due to the solubility effect of a solvent soak on the two layers.

6 Claims, 3 Drawing Sheets (R=H, ALKYL)

PMGI BI-LAYER LIFT-OFF PROCESS

BACKGROUND OF THE INVENTION

This invention pertains to the fabrication of gallium (GaAs) MESFETS, MODFETS, MOSFETS and other structures which require submicron gate metal.

An E-beam process may be used in fabrication of FETS requiring gate metal. However, such a process is expensive and has a relatively low throughput.

An alternative means of fabrication of gate metal FETS is a bi-layer lift-off process. A planarization layer is placed on the GaAs substrate and then covered by a top imaging layer of photoresist. The commonly used Diazo-type Novolac resist is effective for use as the top imaging layer. A new polymer, polymethyl glutarimide (PMGI), supplied by the Shipley Company, is an effective material to form the planarization layer. PMGI has the advantages of very little intermixing with the imaging photoresist layer, a very narrow range sensitivity (between 240 and 280 nm), and it does not require a solvent for development. The narrow range sensitivity of PMGI makes it possible for the layer of photoresist to retain its profile while the PMGI is developed. The problem found with using PMGI as the planarization layer in a bi-layer lift-off structure has been the inability to create a sufficient degree of undercutting for the lift-off profile. Also, the elimination of an intermixing layer that generally exists between the top imaging layer and the bottom planarization layer has proven burdensome.

SUMMARY OF THE INVENTION

It is an object of the present invention to provide a new and improved bi-layer lift-off process which eliminates an intermixing layer between a bottom planarization layer and a top photoresist layer.

It is a further object of the present invention to provide a new and improved bi-layer lift-off process which will improve process yield.

Still another object of the present invention is to provide a new and improved bi-layer lift-off process where the degree of undercutting in the lift-off profile can be varied without affecting the top layer photoresist pattern.

These and other objects and advantages are achieved by subjecting a wafer having a planarization layer of PMGI and a photoresist layer to a chlorobenzene or other solvent soak before the planarization layer is patterned and will become apparent to those skilled in the art upon consideration of the accompanying specification, claims and drawings.

BRIEF DESCRIPTION OF THE DRAWINGS

Referring to the drawings wherein like characters indicate like parts throughout the figures.

DESCRIPTION OF THE PREFERRED EMBODIMENT

Figure 1:
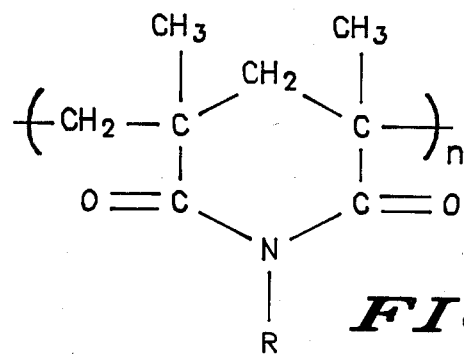
FIG. 1 represents the chemical formula of polydimethyl glutarimide (PMGI) used as a planarization layer in the present invention.
Figure 2A:
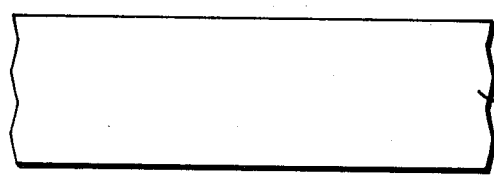
FIGS. 2A, 2B, 2c, 2D, and 2E illustrate the steps of a prior art bi-layer lift-off process.
Figure 2B:
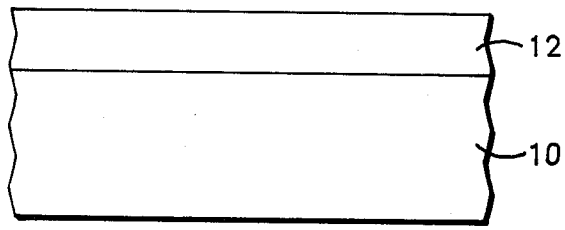

Referring to FIG. 2A, a substrate 10 on which a field effect transistor (FET) is to be manufactured is shown. Substrate 10 may be GaAs or some other appropriate material. FIG. 2B illustrates a planarization layer 12 placed on top of substrate 10. Planarization layer 12 is made of PMGI and is usually 1 $\mu$m thick, however, this thickness may be varied. The chemical composition of PMGI planarization layer 12 is illustrated in FIG. 1.

Figure 2C:
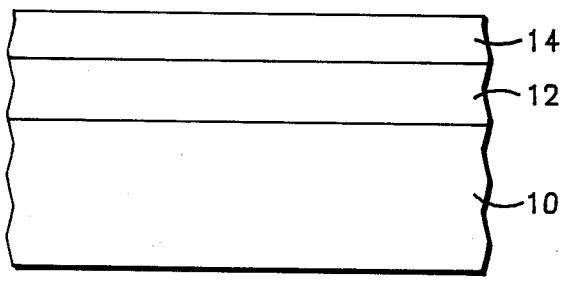
Figure 2D:
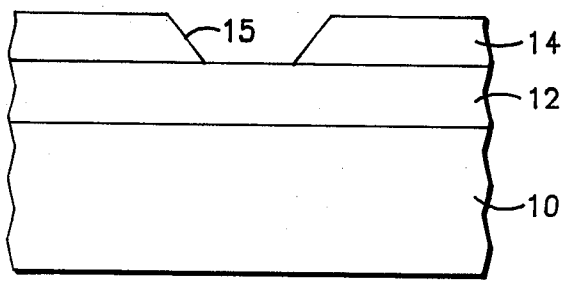

In FIG. 2c, a photoresist layer 14 is placed on planarization layer 12. Photoresist layer 14 often comprises the commonly used AZ1300 series Novolac resist, but other alternatives are available. The thickness of photoresist layer 14 is usually around 0.4 $\mu$m. FIG. 2D shows a developed pattern 15 formed on photoresist layer 14 by exposing with nominal 300 nm light and developing with an appropriate developer.

Figure 2E:
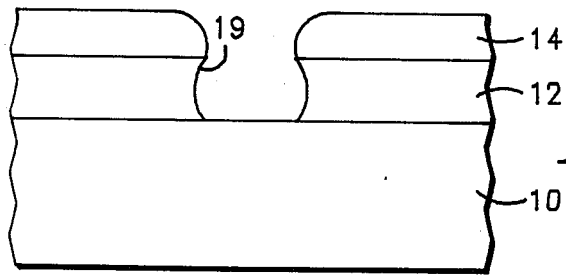

FIG. 2E shows the resulting lift-off structure 17 when planarization layer 12 is flood exposed with 254 nm light and developed with a PMGI developer. The rounding of photoresist layer 14 indicates slight development of photoresist layer 14 with the PMGI developer. This unwanted development can result in efficiency problems during lift-off. Although a slight undercut profile 19 was obtained, the degree of undercutting is insufficient for effective lift-off.

Figure 3A:
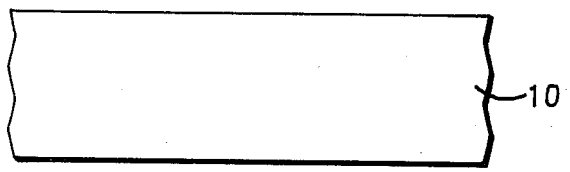
FIGS. 3A, 3B, 3c, 3D, 3E, 3f, 3G, and 3H illustrate the steps of a bi-layer lift-off process embodying the present invention.
Figure 3B:
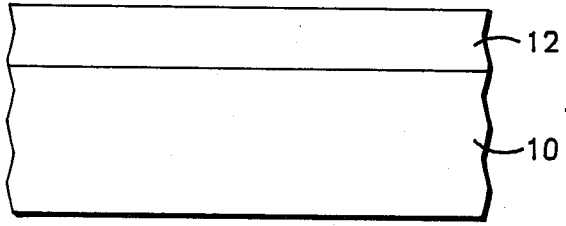
Figure 3C:
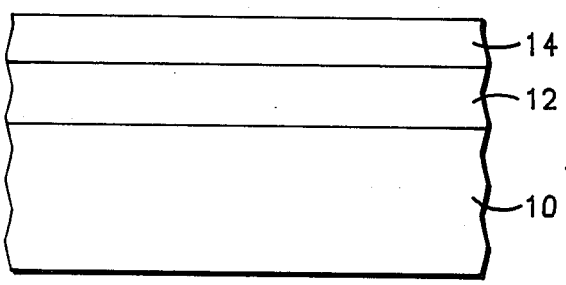
Figure 3D:
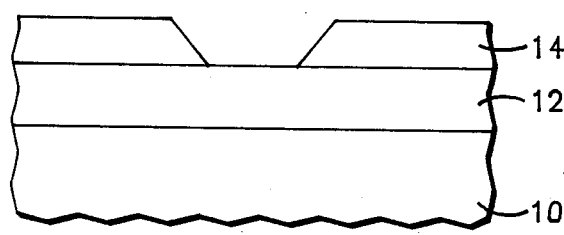
Figure 3E:
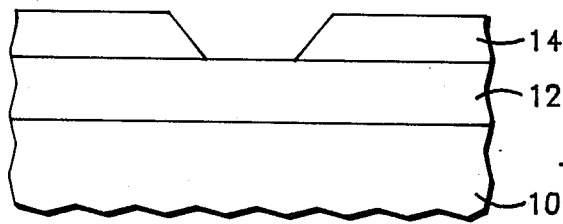

FIGS. 3A, 3B, 3c, and 3D, correspond to FIG. 2A, 2B, 2c, and 2D respectively. Structure 30 illustrated in FIG. 3E, however, is created utilizing an additional step. In order to decrease the solubility of photoresist layer 14 and enhance the solubility of planarization layer 12, a chlorobenzene soak was incorporated into the process. Chlorobenzene not only decreases the solubility of photoresist layer 14 but also enhances the solubility of PMGI layer 12, and, therefore, structure 30 has a photoresist layer 14 less susceptible to development and a PMGI layer more susceptible to development.

Figure 3F:
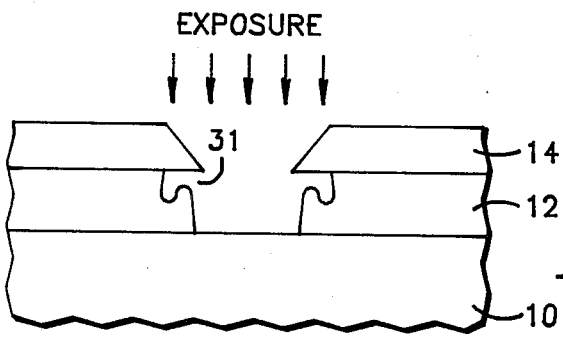

FIG. 3f illustrates lift-off structure 27 after planarization layer 12 has been flood exposed by nominal 254 nm light and developed. Photoresist layer 14 acts as a mask during development of planarization layer 12. Due to the solubility effect of the chlorobenzene soak, undercut profile 31 is created without affecting photoresist layer 14. The degree of undercut profile 31 may be varied by changing the amount of time of the chlorobenzene soak or the temperature at which the soak takes place. A chlorobenzene soak, before exposure of PMGI layer 12, of 3 to 10 minutes in duration at 27° C. has proven to be effective in achieving a desired depth of undercut profile 31. While only a chlorobenzene soak has been mentioned since it yields the most pronounced undercut profile in the shortest period of time, other solvents such as a toluene may be utilized to create similar, albeit less pronounced, undercut structures.

Figure 3G:
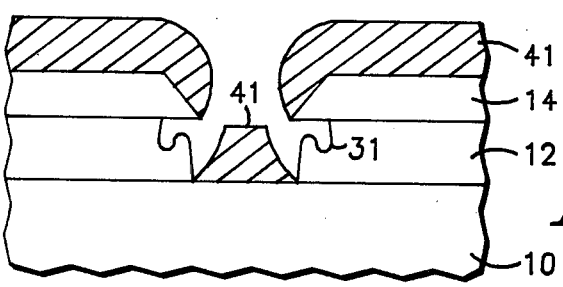
Figure 3H:
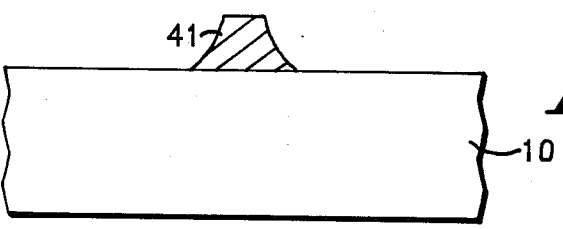

FIG. 3G shows metal 41 evaporated on lift-off structure 27. Undercut profile 31 facilitates the removal of planarization layer 12 and photoresist layer 14 from substrate 10, and the resultant gate metal device of FIG. 3H is created. The resultant structure of FIG. 3H may be created with various thickness and length specifications for gate metal 41.

While a specific embodiment of this invention has been shown and described, further modifications and improvements will occur to those skilled in the art. For example, although in order to provide one specific embodiment of the present invention, specific wavelengths of light utilized during flood exposure for both the development of the top photoresist layer and the development of the PMGI planarization layer were provided, ranges known to those skilled in the art may be utilized. I desire it to be understood, therefore, that this invention is not limited to the particular form shown and I intend to cover all modifications which do not depart from the spirit and scope of this invention.

I claim:

1. A method of forming a lift-off structure for a GaAs substrate having a planarization layer of polydimethyl glutarimide (PMGI) juxtaposed to said GaAs substrate and a defined novolac photoresist layer adjacent to said planarization layer of PMGI comprising the steps of:

soaking the defined photoresist layer and the planarization layer of PMGI with a solvent to decrease the solubility of the defined photoresist layer and enhance the solubility of the planarization layer of PMGI, said soaking step enduring for a predetermined amount of time to ensure a desired solubility effect on the defined photoresist layer and the planarization layer of PMGI; and developing said PMGI layer whereby forming an undercut profile between the planarization layer of PMGI and the defined photoresist.

2. A method of forming a lift-off structure as recited in claim 1 wherein said solvent utilized during said soaking step is chlorobenzene.

3. A method of forming a lift-off structure as recited in claim 1 wherein said solvent utilized during said soaking step is toluene.

4. A bi-layer lift-off process for a wafer having a planarization layer of PMGI and a thin novalac positive photoresist layer on said planarization layer of PMGI comprising the steps of:

placing a mask on said photoresist layer;
   exposing said mask with nominal light;
   removing said mask from said photoresist layer;
   developing said photoresist layer with a developer to create a pattern in said photoresist layer outlined by said mask;
   subjecting said wafer to a chlorobenzene soak for a predetermined time at a predetermined temperature to create a structure having a decreased solubility of said photoresist layer and an increased solubility of said planarization layer of PMGI;
   developing the PMGI revealed through said photoresist layer to create a desired undercut profile between said photoresist and said planarization layer of PMGI and an exposed portion of the wafer, said developing step performed by a developer after flood exposure of nominal light on the wafer with said photoresist layer having positive masking characteristics in relation to said planarization layer of PMGI;
   evaporating metal onto said exposed portion of wafer to form a gate; and
   lifting off said layer of PMGI and said photoresist layer from the wafer by utilizing said undercut profile to enhance being able to grip said planarization layer of PMGI during said lifting off steps.

5. A bi-layer lift-off process as recited in claim 4 wherein the step of subjecting said wafer to a chlorobenzene soak occurs for 3–10 minutes at a temperature of 27° C.

6. A lift-off structure for FET processing comprising a compound semiconductor, a layer of PMGI juxtaposed to said substrate and a defined novelac photoresist layer adjacent to said layer of PMGI wherein an undercut profile is formed in said layer of PMGI beneath said defined layer during development of said PMGI layer due to solubility effects of a chlorobenzene soak, said undercut profile facilitating lift-off.

* * * * *